AUDIO SIGNAL VARIABLE ATTENUATING CIRCUIT
Filed Dec. 24, 1962
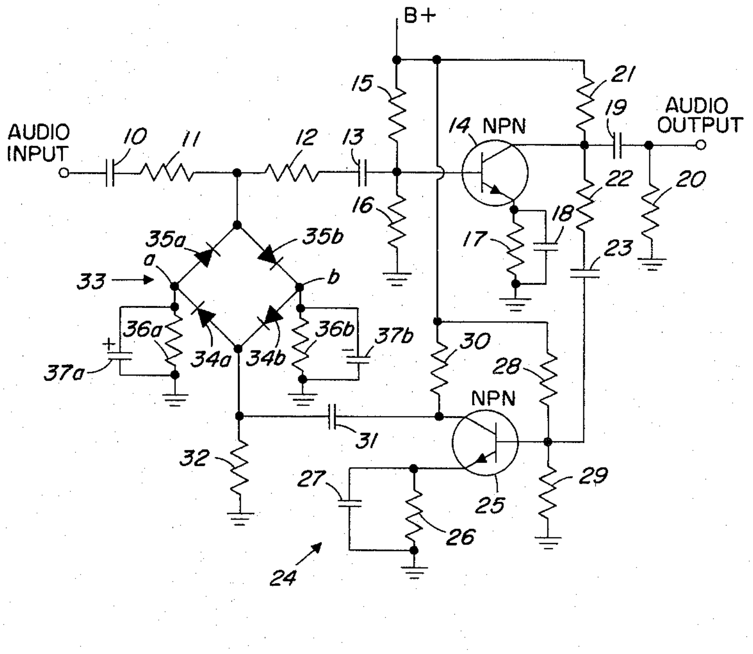
INVENTOR.
PAUL D. FARRIS
BY Moody and Kintzinger
ATTORNEYS United States Patent Office 3,210,680
Patented Oct. 5, 1965

3,210,680
AUDIO SIGNAL VARIABLE ATTENTUATING CIRCUIT

Paul D. Farris, Cedar Rapids, Iowa, assignor to Collins Radio Company, Cedar Rapids, Iowa, a corporation of Iowa Filed Dec. 24, 1962, Ser. No. 246,810
1 Claim. (Cl. 330—26)

This invention relates in general to audio limiter systems, and in particular to an audio amplifier variable attenuation circuit employing feedback for stabilizing the audio output by changing signal input impedance when the input signal is increased above the audio compression or attenuation threshold level.

There are many audio and power limiting systems employing feedback loops for signal limit stabilization. However, many of these existing systems are complicated, expensive, and fall short in providing optimum reliability and desired performance characteristics. Some of the existing feedback controlled signal limiting systems are in continuous operation at a varying level, and some impose excessive undesired loading on signal output circuits and cause signal distortion by excessive feedback signal power requirements.

It is, therefore, a principal object of this invention to provide an amplifier signal limiting system employing feedback only when the signal has attained a predetermined threshold level.

A further object is to provide a fast acting audio limiting system with relatively constant low signal output power loading requirements for varying attenuation of signal input in providing audio limit determining attenuation control in the signal input circuit.

Features of this invention useful in accomplishing the above objects, in an audio amplifier variable attenuation circuit, include an audio input circuit to an amplifier having series resistors, an output from the amplifier having a connection to a feedback loop, including an amplifier and a four diode bridge, connected between the output of the amplifier in the feedback circuit and the common junction of the resistors in the input circuit, and separate capacitors connected between each of the other respective junctions of the diode bridge and ground. Whenever the output of the amplifier exceeds a predetermined threshold, the portion of the audio output fed to the feedback amplifier provides a signal of sufficient amplitude to the diode bridge to bias two diodes to conduction thereby charging the two separate capacitors to opposite charges. This, in turn, biases the other two diodes to conduction causing the A.C. impedance from the junction of the two resistors in the input path through two of the diodes and the separate capacitors to decrease. This results in more of the input being dropped across the first resistor of the two input resistors and lowers the audio input signal by increased attenuation to the main amplifier. With any additional tendency for the audio output to increase, the charging of the two capacitors is increased and the current flow from the junction of the input resistors is increased further attenuating the input signal and effectively stabilizing the audio output when the audio input is above the compression or attenuation threshold level.

A specific embodiment representing what is regarded as the best mode for carrying out the invention is illustrated in the accompanying drawing which represents an audio amplifier variable attenuation circuit having a transistorized feedback amplifying and diode bridge threshold level controlled signal input attenuating circuit.

Referring to the drawing, an audio input signal is coupled through capaictor 10 and fed serially through resistors 11 and 12 and capacitor 13 to the base of NPN transistor 14. A B+ voltage supply is serially connected through resistors 15 and 16 to ground and at the junction of resistors 15 and 16 to both capacitor 13 and the base of transistor 14. The emitter of transistor 14 is connected through resistor 17 and capacitor 18 in parallel to ground while the collector is connected serially through capacitor 19 and resistor 20 to ground for providing audio output, developed across resistor 20, at the junction of capacitor 19 and resistor 20. B+ is additionally connected through resistor 21 to the collector of transistor 14.

In a feedback loop circuit 24 the collector of transistor 14 is also serially connected through resistor 22 and capacitor 23 to the base of feedback signal amplifying NPN transistor 25. For proper biasing of the transistor, the emitter is connected through resistor 26 and capacitor 27 in parallel to ground, and the B+ supply is connected serially through resistors 28 and 29 to ground. The junction of resistors 28 and 29 is connected to the base of transistor 25, and B+ is also connected through resistor 30 to the collector of transistor 25. The collector of transistor 25 is connected through capacitor 31 to resistor 32 and through the resistor 32 to ground.

The feedback output signal of transistor 25 developed across resistor 32 is applied to diode bridge 33 which is also connected to the junction of input circuit resistors 11 and 12. Diode bridge circuit 33 includes four diodes **34*a*, 34*b*, 35*a*, and 35*b*. The common connection of capacitor 31 and resistor 32 is connected to the common junction of the anode of diode 34*a* and the cathode of diode 34*b*, and the common junction of resistors 11 and 12 is connected to the common junction of the cathode of diode 35*a* and the anode of diode 35*b***. The common junction "*a*" between diodes **34*a* and 35*a* is connected through resistor 36*a* and capacitor 37*a*** in parallel to ground, and the common junction "*b*" between diodes **34*b* and 35*b* is connected through resistor 36*b* and the capacitor 37*b*** in parallel to ground.

In operation, a relatively small portion of the output of amplifier transistor 14 is appiled as a feedback whenever there is an audio output and this feedback portion of the audio output is applied through feedback loop circuit 24 to transistor 25 where it is amplified. It should be noted that the portion of audio output fed back is very small without interruptions or sharp variations in loading of the audio output signal. This substantially prevents any material distortion or pronounced discontinuity of the audio output signal.

The output of transistor 25 developed across resistor 32 is applied to diodes **34*a* and 34*b*. When the input signal to transistor 25 is small and the signal applied to diodes 34*a* and 34*b* is below diode firing potential voltage level, diodes 34*a* and 34*b* do not conduct. However, if the feedback signal amplified by transistor 25 is sufficiently increased so that the signal applied to diodes 34*a* and 34*b* exceeds the firing potential levels, on the respective half cycles of the A.C. feedback signal, each of the diodes 34*a* and 34*b* will be biased to a state of conduction during its respective portion of the A.C. signal. The firing potentials of diodes 34*a* and 34*b* are exceeded whenever the input signal is increased above the compression or attenuation threshold level. Further, whenever the audio output signal power is increasing after diodes 34*a* and 34*b*** have started conducting the diodes will conduct for increasing portions of successive respective A.C. half cycles.

Whenever diodes **34*a* and 34*b* conduct capacitors 37*a* and 37*b* become oppositely charged with the polarities indicated. These capacitor charges then bias the resepective diodes 35*a* and 35*b* to conduction for portions of respective half cycles of the input A.C. signal. Thus, A.C. impedance from the junction of resistors 11 and 12 through diode 35*a* and capacitor 37*a* to ground and through diode 35*b* and capacitor 37*b* to ground is decreased. This results in more of the input signal being dropped across resistor 11 thereby attenuating the input signal and lowering the portion of the audo input applied to amplifier transistor 14. Of course, with increasing, or increased, audio output signals, above the compression or attenuation threshold, and with increased charging of capacitors 37***a* and 37*b*, a higher percentage of the input signal will be passed through diodes 35*a* and 35*b* and the respective capacitors 37*a* and 37*b* to ground and increased portions of the input signal will be dropped across resistor 11. This results in excellent stabilization of the audio output when the audio input is above the compression or attenuation threshold level.

Components used in a working audio amplifier variable attenuation circuit for a transceiver include the following:

| | |
|---|---|
| Capacitor **10** | 15 µf. |
| Resistor **11** | 10K ohms. |
| Resistor **12** | 1K ohms. |
| Capacitor **13** | 15 µf. |
| NPN Transistor **14** | 2N706. |
| Resistor **15** | 22K ohms. |
| Resistor **16** | 22K ohms. |
| Resistor **17** | 4.7K ohms. |
| Capacitor **18** | 47 µf. |
| Capacitor **19** | 47 µf. |
| Resistor **20** | 1K ohms. |
| Resistor **21** | 470 ohms. |
| Resistor **22** | 1K ohms. |
| Capacitor **23** | 47 µf. |
| NPN Transistor **25** | 2N706. |
| Resistor **26** | 2K ohms. |
| Capacitor **27** | 47 µf. |
| Resistor **28** | 22K ohms. |
| Resistor **29** | 15K ohms. |
| Resistor **30** | 1K ohms. |
| Capacitor **31** | 47 µf. |
| Resistor **32** | 1N457. |
| Diode **34***a* | 1N457. |
| Diode **34***b* | 1K ohms. |
| Diode **35***a* | 1N457. |
| Diode **35***b* | 1N457. |
| Resistor **36***a* | 10K ohms. |
| Resistor **36***b* | 10K ohms. |
| Capacitor **37***a* | 47 µf. |
| Capacitor **37***b* | 47 µf. |

An audio amplifier variable attenuation circuit utilizing PNP transistors in place of NPN transistors 14 and 25 and using a B− voltage supply in place of the B+ voltage supply would give substantially the same operating results as with the circuit shown and described.

Whereas this invention is here illustrated and described with respect to several embodiments thereof, it should be realized that various changes may be made without departing from the essential contributions to the art made by the teachings hereof.

I claim:

An A.C. signal amplifying and limiting system having input means with signal variable attenuating means including: a signal amplifying transistor coupled to said input means; output means connected to the output of said amplifying transistor; a signal feedback circuit connected to said output means; a portion of said signal feedback circuit being a feedback signal threshold level responsive circuit connected as part of said attenuating means for varying the attenuation of A.C. input signals above a predetermined threshold level and with said feedback circuit and said feedback signal threshold level responsive circuit including only four diodes; wherein said signal variable attenuating means includes, resistive means in the signal path of said input means; and with the threshold level responsive circuit being a four diode bridge including the said four diodes connected together cathode to anode around the bridge and with four common junctions between respective sets of diodes and in two pairs of opposite junctions; with one pair of opposite junctions of the diode bridge connected to said resistive means and to said feedback circuit respectively; and individual parallel resistor and capacitor circuits connected between each of the other two diode bridge junctions and ground; a feedback signal amplifying transistor in said feedback circuit; impedance means circuitry interconnecting said output means and said feedback signal amplifying transistor; and with the diodes of the diode bridge being solid state diodes.

References Cited by the Examiner

UNITED STATES PATENTS

| | | | |
|---|---|---|---|
| 2,144,995 | 1/39 | Pulvari-Pulvermacher | 328—165 X |
| 2,952,006 | 9/60 | McCarter | 330—145 X |
| 2,999,169 | 9/61 | Feiner | 330—28 X |

ROY LAKE, *Primary Examiner.*